(12) United States Patent
Corma Canos et al.

(10) Patent No.: US 7,108,802 B2
(45) Date of Patent: Sep. 19, 2006

(54) ELECTROLUMINESCENT MATERIAL CONTAINING A CONJUGATED POLYMER OR METAL COMPLEXES INSIDE ZEOLITES AND POROUS MATERIALS AND THE PREPARATION METHOD THEREOF

(75) Inventors: Avelino Corma Canos, Valencia (ES); Maria Sales Galletero Pedroche, Valencia (ES); Mercedes Alvaro Rodríguez, Valencia (ES); Hermenegildo García Gómez, Valencia (ES)

(73) Assignees: Consejo Superior de Investigaciones Cientificas, Madrid (ES); Universidad Polirecnica de Valencia, Valencia (ES)

( * ) Notice: Subject to any disclaimer, the term of this patent is extended or adjusted under 35 U.S.C. 154(b) by 0 days.

(21) Appl. No.: 11/026,328

(22) Filed: Dec. 30, 2004

(65) Prior Publication Data
US 2005/0163992 A1 Jul. 28, 2005

Related U.S. Application Data

(63) Continuation of application No. PCT/ES03/00322, filed on Jun. 28, 2003.

(30) Foreign Application Priority Data
Jul. 1, 2002 (ES) ............................... 200201588

(51) Int. Cl.
C01B 39/00 (2006.01)
C01B 37/00 (2006.01)
C08G 61/00 (2006.01)
C09K 11/06 (2006.01)
H01L 51/54 (2006.01)

(52) U.S. Cl. ................. 252/301.16; 313/503; 428/690; 428/917

(58) Field of Classification Search ..................... None
See application file for complete search history.

(56) References Cited

U.S. PATENT DOCUMENTS 3,702,886 A 11/1972 Argauer et al.
4,954,325 A 9/1990 Rubin et al.

FOREIGN PATENT DOCUMENTS

WO WO 90/13148 11/1990
WO WO 03/58728 * 7/2003

OTHER PUBLICATIONS

Pattantyus-Abraham et al, "Photoluminescence of Poly(P-Phenylene Vinylene) Encapsulated In Mesoporous Silica", Mat. Res. Symp. Proc. vol. 560, pp. 291-295, 1999.*

(Continued)

Primary Examiner—C. Melissa Koslow
(74) Attorney, Agent, or Firm—Klauber & Jackson (57) ABSTRACT

An electroluminescent material comprising at least one electroluminescent compound supported in a matrix, wherein the matrix is selected from among microporous and mesoporous materials, selected from among zeolites, porous oxides, molecular sieves, silicoaluminophosphates and aluminosilicates, the electroluminescent compound is selected from among polymers derived from polyphenylenevinylene, complexes of IIIA group metal ions with 8-hydroxyquinoline and combinations thereof, and where the electroluminescent compound is housed in interior spaces of the matrix. These electroluminescent materials possess excellent properties in terms of chemical stability towards the environment (oxygen, humidity, $CO_2$, etc.), durability (number of electroluminescent cycles under aerobic conditions), control of the state of aggregation (isolated or being associated in pairs or more) of aromatics.

29 Claims, 6 Drawing Sheets

OTHER PUBLICATIONS

J. Shinar et al, Optically Detected Magnetic Resonance (ODMR) Studies of π-Conjugated Polymer Films and Light-Emitting Diodes (LEDs), Proc. SPIE-Int. Soc. Opt. Eng., 1995, 2528, pp. 32-45).

A.B. Holmes, et al, Photoluminescence and Electroluminescence in Conjugated Polymeric Systems, Synth. Met., 1993, 57, pp. 4031-4040.

J.J.M. Halls, et al, Light-emitting and photoconductive diodes fabricated with conjugated polymers, Thin Solid Films, 1996, 276, pp. 13-20).

R.H. Friend, Conjugated polymers. New materials for optoelectronic devices, Pure Appl. Chem., 2001, 73, pp. 425-430).

R.H. Friend et al, Electroluminescence in conjugated polymers, Nature, vol. 397, Jan. 1999, pp. 121-128).

R.H. Friend, Semiconductor Device Physics with Conjugated Polymers, Phys. Scr., T, 1996, pp. 9-15).

R.H. Friend et al, Conjugated Polymer Electroluminescence, Phys. Prop. Polym. Handb., 1996, pp. 479-487).

F. Babou, et al, Sulfated Zirconia for η-Butane Isomerization Experimental and Theoretical Approaches, Stud. Surf. Catal., 1994, 90, pp. 519-529).

D.R. Baigent et al, Light-emitting diodes fabricated with conjugated polymers—recent progress, Synth., Met., 1194, 67, pp. 3-10.

D.R. Baigent et al, Light-Emitting Diodes Fabricated With Conjugated Polymers, Solid-State Electron., 1996, 40, pp. 477-485.

H. Becker et al, , Optically and Electrically Excited Semiconducting Polymer Structures, Mater. Res. Sco. Symp. Proc., 1998, 488, pp. 3-14.

D.D.C. Bradley et al, Conjugated Polymer Electro-optic Devices, Spec., Publ.—R. Sco. Chem., 1993, 125, pp. 120-133.

A.R. Brown et al, Conjugated Polymer Light-emitting Diodes, NATO ASI Ser. E., 1993, 246, pp. 87-106.

J. Morgado et al, Environmental aging of poly p-phenylenevinylene based light-emitting diodes, Synth. Met., 2000, 114, pp. 189-196.

A Camblor et al, Influence of the synthesis conditions on the crystallization of zeolite Beta, Zeolites, 1991, 11, pp. 792-797.

Y. Hamada et al, Organic light-emitting diodes using a gallium complex, Appl. Phys. Lett., 1998, 72, pp. 1939-1941.

X.T. Tao et al, Highly Efficient Blue Electroluminescence of Lithium Tetra-(2-methyl-8-hydroxy-quinolinato) Boron, J. Am. Chem. Soc., 1999, 121, pp. 9447-9448.

A. Corma et al, Delaminated zeolite precursors as selective acidic catalysts, Nature, 1998, 396, pp. 353-356.

A. Corma et al, AlITQ-6: Synthesis, Characterization, and Catalytic Activity, and TiITQ-6Angew. Chem., 2000, 39, pp. 1499-1501.

A. Corma et al, Synthesis and characterization of the MCM-22 zeolite, Zeolites, 1995, 15, pp. 2-8.

P. Behrens et al, Ordered Molecular Arrays as Templates: A New Approach to the Synthesis of Mesoporous Materials, Angew. Chem., Int. Ed. Engl. 1993, 32, pp. 696-699.

P. Behrens, Mesoporous Inorganic Solids, Adv. Mater., 1993, 5, pp. 127-132.

L.M. Leung et al, A High-Efficiency Blue Emitter for Small Molecule-Based Organic Light-Emitting Diode, J. Sm. Chem. Soc., 2000, 12, pp. 5640-5641.

* cited by examiner

ELECTROLUMINESCENT MATERIAL CONTAINING A CONJUGATED POLYMER OR METAL COMPLEXES INSIDE ZEOLITES AND POROUS MATERIALS AND THE PREPARATION METHOD THEREOF

RELATED APPLICATIONS

The present application is a Continuation of co-pending PCT Application No. PCT/ES2003/000322, filed Jun. 28, 2003 which in turn, claims priority from Spanish Application Serial No. P200201588, filed on Jul. 1, 2002. Applicants claim the benefits of 35 U.S.C. §120 as to the PCT application and priority under 35 U.S.C. §119 as to said Spanish application, and the entire disclosures of both applications are incorporated herein by reference in their entireties.

The present invention belongs to the field of electroluminescent materials, particularly those with a polymer structure derived from polyphenylenevinylene and complexes of ions of IIIA group metals with 8-hydroxyquinoline and derivatives included or deposited with a support.

STATE OF THE ART PRIOR TO THE INVENTION

It has been known for a number of years that certain materials and compounds have photochemical properties that convert them into electroluminescent materials (J. Shinar, N. C. Greenham and R. H. Friend, Proc. SPIE-Int. Soc. Opt. Eng., 1995, 2528, 32) (A. B. Holmes, D. D. C. Bradley, A. R. Brown, P. L. Burn, J. H. Burroughes, R. H. Friend, N. C. Greenham, R. W. Gymer and D. A. Halliday, Synth. Met., 1993, 57, 4031) (J. J. M. Halls, D. R. Baigent, F. Cacialli, N. C. Greenham, R. H. Friend, S. C. Moratti and A. B. Holmes, Thin Solid Films, 1996, 276, 13) (R. H. Friend, Pure Appl. Chem., 2001, 73, 425) (R. H. Friend, R. W. Gymer, A. B. Holmes, J. H. Burroughes, R. N. Marks, C. Taliani, D. D. C. Bradley, D. A. Dos Santos, J. L. Bredas, M. Logdlund and W. R. Salaneck, Nature, 1999, 397, 121) (R. H. Friend, Phys. Scr., T, 1996, 9–15) (R. H. Friend and N. C. Greenham, Phys. Prop. Polym. Handb., 1996, 479) (F. Babou, B. Bigot, G. Coudurier, P. Sautet and J. C. Vedrine, Stud. Surf. Catal., 1994, 90, 519) (D. R. Baigent, N. C. Greenham, J. Gruener, R. N. Marks, R. H. Friend, S. C. Moratti and A. B. Holmes, Synth. Met., 1994, 67, 3) (D. R. Baigent, F. Cacialli, N. C. Greenham, J. Gruner, H. F. Wittmann, R. H. Friend, S. C. Moratti and A. B. Holmes, Solid-State Electron., 1996, 40, 477) (H. Becker, S. E. Burns, G. J. Denton, N. T. Harrison, N. Tessler, T. D. Wilkinson and R. H. Friend, Mater. Res. Soc. Symp. Proc., 1998, 488, 3) (D. D. C. Bradley, A. R. Brown, P. L. Burn, J. H. Burroughes, R. H. Friend, N. C. Greenham, R. W. Gymer, A. B. Holmes, A. M. Kraft and R. N. Marks, Spec,. Publ. —R. Soc. Chem., 1993, 125, 20) (A. R. Brown N. C. Greenham, R. W. Gymer, K. Pichler, D. D. C. Bradley, R. H. Friend, P. L. Burn, A. Kraft and A. B. Holmes, NATO ASI Ser. E., 1993, 246, 87).

There exist electroluminescent compounds which have as their main feature that of possessing an intense emission in the blue ($\lambda$=490 to 550 nm) and have applications in light emitting systems (LED or light emitting diodes). These types of compounds, with emission in the blue, differ considerably in their chemical structure. One type of electroluminescent compound consists of a conjugated polymer of the type p-phenylenevinylene (I), which is prepared by polymerisation of the appropriate monomer precursors obtained, for example, by reaction of p-phenylenemethylene dibromide with tetrahydrothiophene followed by heating in a basic medium, where the polymerisation takes place and a final stage of elimination (Number PCT/GB90/00584; Inventors: Friend, R. H.; Burroughes, J. H.; Bradley, D. D.).

A second type of compound (II) with activity for LEDs consists of complexes of IIIA group metal ions with 8-hydroxyquinoline or derivatives as a ligand. These complexes, which in general possess an octahedral structure around a metal ion, can be prepared starting from the aromatic heterocyclic quinoline compound by reaction with lithium borohydride or hydrides of other IIIA group metals.

It is known (J. Morgado, R. H. Friend and F. Cacialli, Synth. Met., 2000, 114, 189 and the references cited therein) that the compounds described above undergo a gradual loss of their electroluminescent capacity owing to their partial decomposition by reaction with atmospheric oxygen and humidity. It is also known that the configuration of the double bonds in the chain and the conformation of the polymer influence the electroluminescent properties of it. On the other hand, metal complexes also undergo degradation and are affected by phenomena of aggregation and ageing which diminish their electroluminescent capacity.

DESCRIPTION OF THE INVENTION

The object of the present invention is to make available new electroluminescent materials possessing excellent properties in terms of chemical stability towards the environment (oxygen, humidity, $CO_2$, etc.), durability (number of electroluminescent cycles under aerobic conditions), control of the state of aggregation (isolated or being associated in pairs or more).

The new materials present an excellent durability which is achieved by means of incorporating an electroluminescent component into the interior of an inert and rigid matrix, which interior spaces (micro- or mesopores) define a compartmentalised space where the electroluminescent host is housed. The matrix of the porous material protects the encapsulated host from attack by outside agents at the same time as providing a degree of control over its molecular and electroluminescent properties. At the same time, the incorporation inside the pores of the matrix permits an intimate reaction with other hosts or ions which act by donating or accepting electrons (co-doping compounds) or by modifying any property of the electroluminescent compound.

The inclusion of these electroluminescent hosts inside the inorganic materials formed from micro- or mesoporous molecular sieves permits the preparation of new electroluminescent materials that are less sensitive to $O_2$, humidity and $CO_2$, as well as controlling the preferred conformations and the aggregation of the occluded hosts. Equally, it is possible to achieve a variation of the electroluminescent properties of the active component by means of co-inclusion of inorganic ions (alkalis, alkaline earths, earths and transition metals), as well as other organic hosts that are donors or acceptors of electrons, among which can be mentioned fullerene ($C_{60}$, $C_{70}$, etc.), methylviologene, ruthenium (II) tris bipyridil, 2,4,6-triphenylpyriliums and derivatives of tetrathiofulvalene. In the case of voluminous co-doping agents, molecular sieves are required of a pore size sufficiently large for permitting their inclusion.

The present invention therefore refers to a new type of organic-inorganic hybrid material consisting of an organic host or metal complex formed from the electroluminescent compounds mentioned earlier, included in the channels or cavities of micro- or mesoporous structures formed by regular channels of pore dimensions larger than 0.55 nm such as zeolites, silicoaluminophosphates (SAPOS) and mesoporous molecular sieves such as MCM-41, MCM-48, HSM, SBA-15, for example.

Specifically, the present invention refers to an electroluminescent material comprising at least one electroluminescent compound supported in a matrix, wherein the matrix is selected from among microporous and mesoporous materials, selected from among zeolites, porous oxides, molecular sieves, silicoaluminophosphates and aluminosilicates, the electroluminescent compound is selected from among polymers derived from polyphenylenevinylene, complexes of IIIA group metal ions with 8-hydroxyquinoline and combinations thereof, and the electroluminescent compound is housed in interior spaces of the matrix.

In accordance with the invention, the matrix can be a zeolite selected from among CsX zeolites, KX zeolites NaY, KY zeolites CsY, and combinations thereof, in which case the composite is preferably a conjugated polymer of phenylenevilidene. So the matrix can be zeolite CsX and the electroluminescent material polyphenylenevinylene.

The matrix can also be a molecular sieve selected from among molecular sieves MCM-41, MCM-48, HSM, SBA-15, and combinations thereof. The mesoporous molecular sieve preferably has an Si/Al ratio between 5 and $\infty$.

In accordance with the invention, the electroluminescent material can also consist of a zeolite comprising in its interior a complex comprising at least one IIIA group metal with at least one derivative of 8-hydroxyquinoline.

For example, the matrix can be,

MCM-22 zeolite and the complex is a hydroxyquinolinate complex of boron housed inside the zeolite;

NaY zeolite and the complex is an 8-hydroxyquinaldinate complex of Al encapsulated in the NaY zeolite;

zeolite NaY which contains an 8-hydroxyquinaldinate complex of Ga encapsulated;

mesoporous borosilicate (B)MCM-41 and the complex is an encapsulated 8-hydroxyquinaldinate complex of Al;

zeolite Al/MCM-41 and the electroluminescent material is polyphenylenevinylene.

In accordance with the invention, the material can in addition contain a doping agent which can be selected from among metal ions, electron donor organic molecules, electron acceptor organic molecules and combinations thereof.

When the electroluminescent compound is a polymer derived from polyphenylenevinylene, the electroluminescent material can be obtained by means of a process comprising:

a first stage wherein an inorganic material with ion exchange capacity selected from among zeolites (such as CsX zeolites, NaY zeolites, CsY zeolites and combinations thereof), porous oxides, molecular sieves (preferably with an Si/Al ratio between 5 and $\infty$ and which can be, for example, MCM-41, MCM-48, HSM, SBA-15, and combinations thereof), silicoaluminophosphates and aluminosilicates, is subjected to ion exchange with a solution of p-phenylenedimethylene-1,1-bis(tetrahydrothiophen-1-ium) bromide or derivatives in order to obtain an exchanged impregnated material;

a second stage comprising subjecting the material containing the exchanged dication p-phenylenedimethylene to heating until a polymer derived from polyphenylenevinylene encapsulated in the exchanged material, is formed; and a third stage comprising purifying the electroluminescent material by means of solid-liquid extraction. The extraction can be carried out using $CH_2Cl_2$ as solvent.

When the electroluminescent compound is selected from among complexes of ions of IIIA group metals with 8-hydroxyquinoline or derivatives, the electroluminescent material of the present invention can be obtained by means of a process comprising:

forming complexes of IIIA group metal ions with a compound of 8-hydroxyquinoline selected from among 8-hydroxyquinoline and derivatives of 8-hydroxyquinoline in an inorganic material selected from among zeolites, porous oxides, molecular sieves, silicoaluminophosphates and aluminosilicates in order to obtain a solid wherein said complexes are formed inside the inorganic matrix; and separating the solid and subjecting the recovered solid to a solid-liquid extraction in a solvent in order to obtain the electroluminescent material. The extraction can be carried out using, for example, $CH_2Cl_2$ as solvent.

In a first preferred embodiment of this process, the complexes between the IIIA group metal ions and the organic ligand can be formed by means of a suspension stage wherein the inorganic material in which the IIIA group metal is previously incorporated by ion exchange is suspended in a solution of the organic ligand in a solvent, which can be selected from among alcohols, ketones and halogenated solvents. The suspension is preferably stirred at a temperature between ambient and reflux temperature, during 2 to 24 hours.

By means of this first embodiment of the process, electroluminescent materials can, for example, be prepared wherein the complexes are complexes of 8-hydroxyquinaldinate of Al and the inorganic support is zeolite Al—NaY prepared from NaY zeolite exchanged with $Al^{3+}$;

the complexes are complexes of 8-hydroxyquinaldinate of $Ga^{3+}$ and the inorganic support is zeolite Ga—NaY prepared from zeolite NaY exchanged with $Ga^{3+}$;

the complexes are complexes of 8-hydroxyquinolinate of Al and the inorganic support is MCM-42 prepared from MCM-41 exchanged with $Al^{3+}$;

In an embodiment of the process described above, the inorganic support containing IIIA group metal ions has previously been impregnated with 8-hydroxyquinoline dissolved in dichloromethane and heated.

In a second embodiment of the process, the complexes between the IIIA group metal ions and the compound can be formed by means of the stages of:

mixing the inorganic material containing the IIIA group metal in its crystal lattice with the compound in solid form, until a uniform mixture is obtained; and heating the mixture in vacuum for between 12 and 48 hours at a temperature between 50 and 300° C.

By means of this second embodiment of the process, electroluminescent materials can, for example, be prepared wherein the complex is boron hydroxyquinolinate, the compound is 8-hydroxyquinaldine and the inorganic support is MCM-22.

The electroluminescent materials described above can be used for forming electrodes such as, for example, in the form of a micrometric film.

BRIEF DESCRIPTION OF THE FIGURES

Described below are some of the ways of embodying the invention and certain examples, wherein reference is made to some figures wherein.

DESCRIPTION OF MODES OF EMBODYING THE INVENTION

I.—Preparation, characterisation and electroluminescent properties of polyphenylenevinylene and derivatives encapsulated inside zeolites and porous aluminosilicates.

The inclusion of electroluminescent compounds can preferably be carried out in medium and large pore zeolites such as ZSM-5, MCM-22, ferrierite, faujastites X and Y and micro- or mesoporous molecular sieves with ion exchange capacity. These molecular sieves contain in their composition elements of the group of Si, Al, in addition to $Fe^{3+}$, Ge, Ti, V, Sn and mixtures thereof. More specifically, micro- or mesoporous molecular sieves, formed from silica or silicates of trivalent compounds such as Al, B, Ga, Fe, Cr or mixtures thereof, which can in addition contain Ti, V, Sn or mixtures thereof, can be used. These molecular sieves can be exchanged in different proportions with alkaline, alkaline earth, IIIA group and transition metals, or they can be prepared in the protonic and ammonium form. As mesoporous sieves, aluminosilicates can be used of the type MCM-41, MCM-48 and, with an Si/Al ratio of between 5 and $\infty$.

The preparation of the hybrid electroluminescent materials of the present invention can be carried out by treating the inorganic component consisting of the micro- or mesoporous molecular sieve with an aqueous solution of between 0.03 and 0.1 M of p-phenylenedimethylene-1,1-bis(tetrahydrothiophen-1-ium) dibromide or derivatives, with the solid being subjected to ion exchange at temperatures between 80–120° C. during a period of time between 5 minutes and 12 h. The ion exchange process can optionally be repeated using solutions of the compound of p-phenylenedimethylene-1,1-bis(tetrahydrothiophen-1-ium) dibromide in concentrations of up to 1 M. The resulting solid is subjected to heating at between 150 and 300° C. during 24 h and in vacuum, followed by an extraction process.

The resulting material contains the corresponding polymer derived from polyphenylenevinylene, encapsulated inside the inorganic molecular sieve. The contents in organic polymers lie between 0.1 and 10% by weight of carbon.

Figure 1:
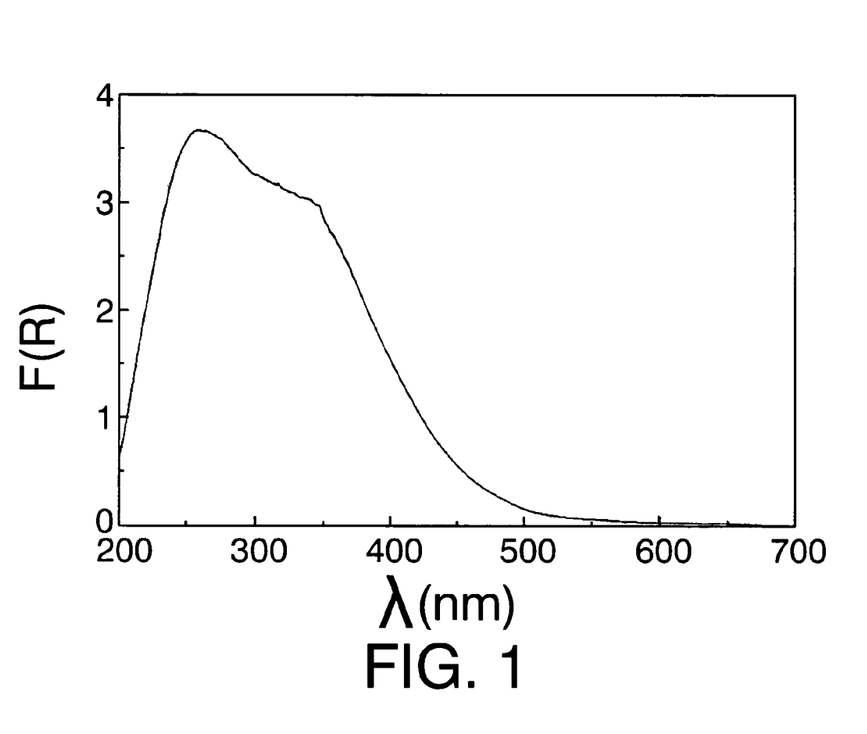
FIG. 1 is a UV-Vis spectrum obtained by means of the technique of diffuse reflectance of a sample of a polymer derived from polyphenylenevinylene, encapsulated inside CsX zeolite.

The structure of the polymer is unequivocally confirmed by means of spectroscopic techniques. So, for the case of materials containing the polymers of type I, the presence of an absorption band with $\lambda_{max}$=250 nm with a shoulder~350 nm can be observed in UV-Vis spectroscopy, which coincides with that described for this polymer when it is not occluded in inorganic materials. FIG. 1 illustrates the UV-Vis spectrum of a polymer derived from phenylenevinylene, encapsulated inside the inorganic molecular sieve, CsX.

Figure 2:
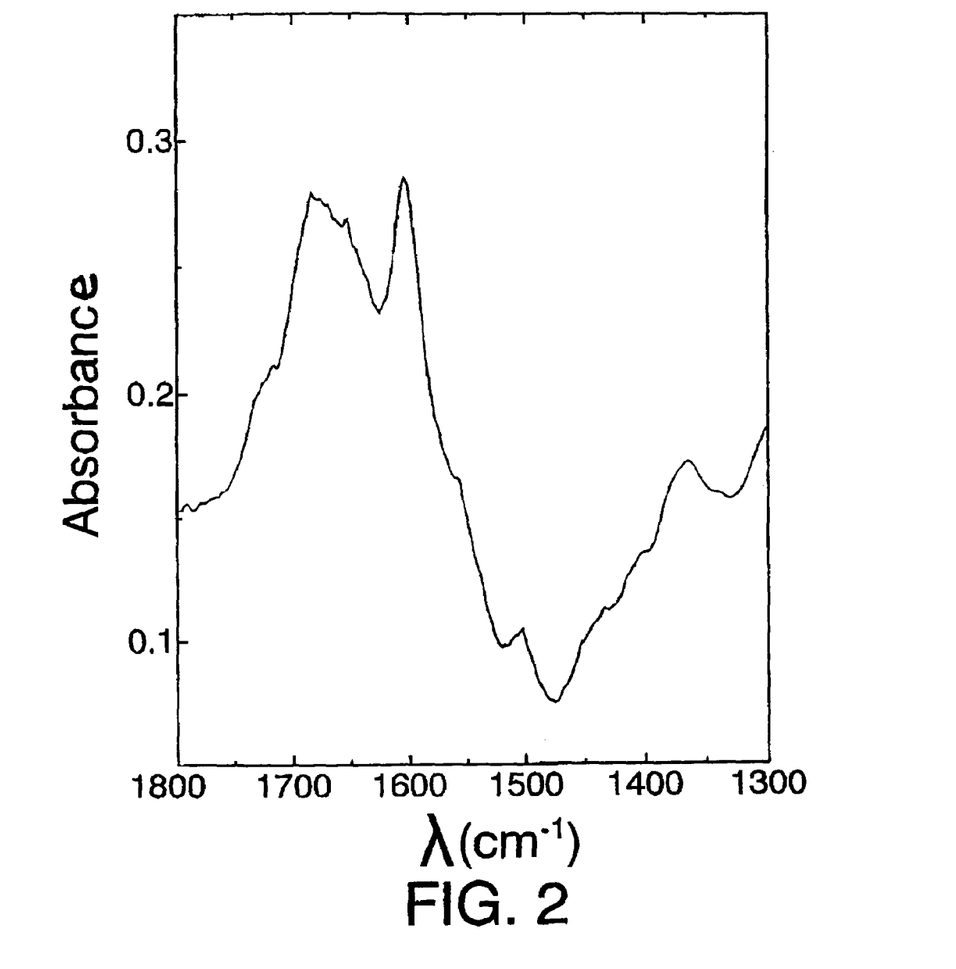
FIG. 2 illustrates a region of the infrared (IR) spectrum of the sample of the polymer polyphenylenevinylene, in the CsX zeolite. The spectrum was recorded at ambient temperature and reduced pressure following heating of the material to 200° C. during one hour.
Figure 3:
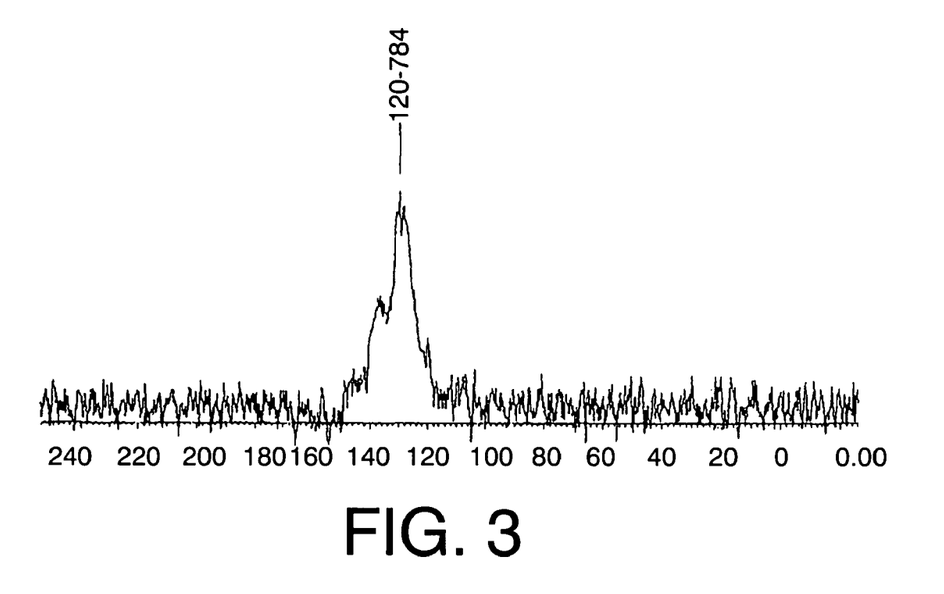
FIG. 3 is an NMR-13C resonance spectrum of solids of the polymer polyphenylenevinylene, in the zeolite CsX with a single broad signal at 128.7 ppm.

In infrared spectroscopy, standing out as the most characteristic vibration is the peak at 1640 cm-1 characteristic of conjugated double bonds. FIG. 2 illustrates the region of the infrared spectrum of a sample of polyphenylenevinylene encapsulated inside an inorganic molecular sieve. In NMR-$^{13}$C resonance of solids, a single broad signal is observed at 128.7 ppm, characteristic of carbons with $sp^2$ hybridisation, notable here being the complete absence of any signal corresponding to the monomer sulphonium cation or to synthesis impurities containing carbons with $sp^3$ hybridisation. FIG. 3 shows an NMR-$^{13}$C resonance spectrum of solids of polyphenylenevinylene, encapsulated inside an inorganic molecular sieve.

Figure 4:
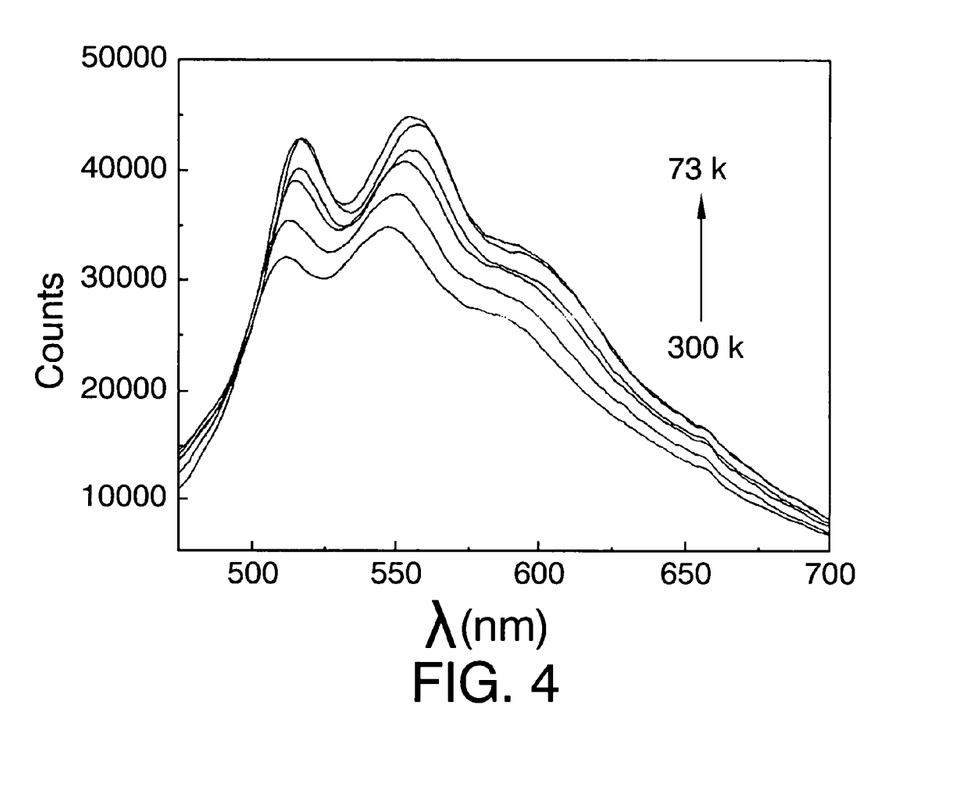
FIG. 4 illustrates luminescence spectra for the sample of the polymer polyphenylenevinylene, encapsulated in the CsX zeolite when the sample is excited at 350 nm. The spectra are recorded at temperatures between ambient and 73K.

The material formed from the inorganic support comprising polymers of type I emits blue light ($\lambda_{max}$=450 –700) when excited at a wavelength between 340 and 380 nm at ambient temperature. The intensity of the emission and the resolution of the bands increase as the temperature at which the sample is to be found drops. A representative emission spectrum is shown in FIG. 4.

The preparation of materials bearing type I polymers can likewise be carried out starting from an inorganic molecular sieve in which, as well as any of the metal or inorganic ions mentioned, there is also present an electron donor or acceptor organic species, such as for example any fullerene and in particular $C_{60}$ and $C_{70}$, any viologene, 2,4,6-triphenylpyrilium or N-alkylpyridinium cation and tetrathiofulvalene and its derivatives or any combination thereof.

Once the electroluminescent hybrid materials have been obtained, a device can be obtained comprising two electrodes containing between them the material of the present invention, following techniques known in the art. One procedure for preparation of those electrodes would consist of depositing the hybrid material starting from a suspension in acetone or dichloromethane or other volatile solvent on a transparent conductor electrode of ITO (indium tin oxide).

The deposition can be carried out by spreading a film over a transparent conductor electrode of ITO with a suitable roller or by means of allowing a drop to fall into a plate rotating at 1000 rpm or faster (spin-coating). The estimated thickness of the films can vary between 0.1 and 20 microns. This electrode acts as a cathode.

As anode, another transparent ITO electrode can be used, without doping or doped with a metal such as Ca, Al or Au. Alternatively, an opaque, totally metallic electrode of Al, with or without doping, can also be used. The two electrodes, one of which supports the film of solid inorganic hybrid material containing the electroluminescent polymer incorporated into it, is positioned above the other, preventing them from coming into contact by means of a thin film of Teflon® of thickness 5 μm, duly cut in order to create a window in the centre.

Optionally, and with the aim of improving the electronic contact, a solution of potassium iodide and iodine in anhydrous ethyleneglycol (0.5 M and 0.05 M of KI and I, respectively) can be added to the layer of electroluminescent material.

Figure 5:
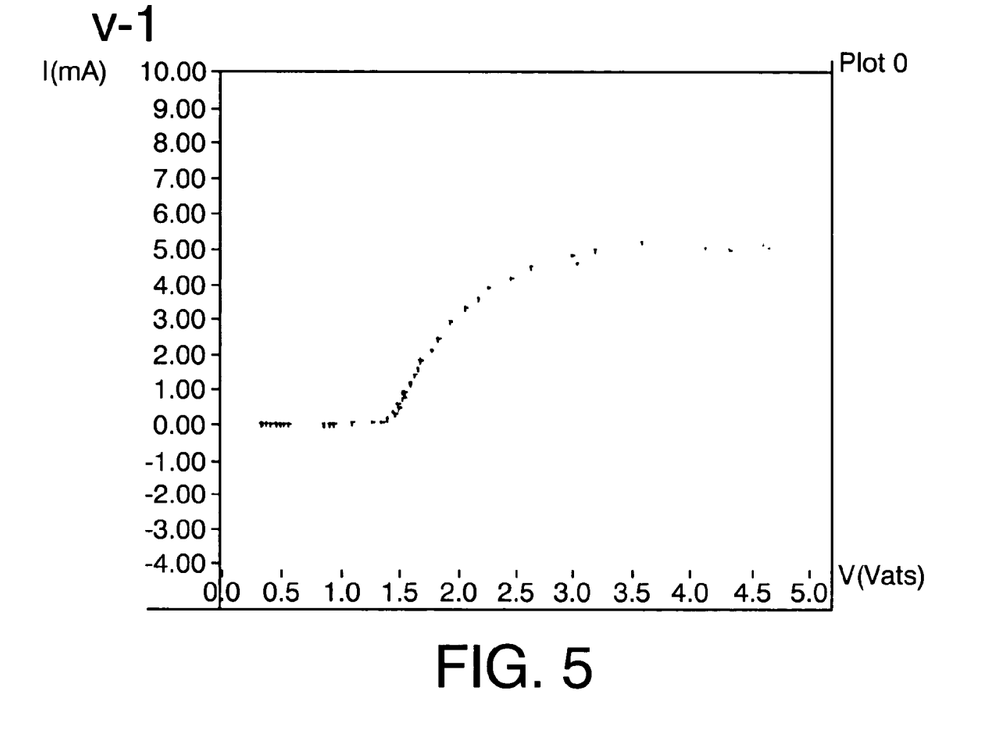
FIG. 5 shows a current response towards an applied voltage for a film of PPV film encapsulated in CsX zeolite on an ITO cathode.

The application of a direct current voltage of between 0 and 40 V permits visual observation of blue light being emitted by the electroluminescent system. A typical response-voltage profile for complexes of p-phenylenevinylene in zeolite CsX is shown in FIG. 5.

II.—Detailed description of the preparation, characterisation and electroluminescent properties of earth metal complexes with 8-hydroxyquinoline, encapsulated inside zeolites and porous aluminosilicates.

The systems to which this section refers use for their preparation the following zeolites as inert porous matrices of the electroluminescent materials:

1. Zeolites containing boron in the lattice with an Si/B ratio of between 5 and 1000. The structure of these porous solids corresponds to zeolites type BEA (M. A. Camblor, A. Mifsud and J. Pérez-Pariente, Zeolites, 1991, 11,792), ZSM-5 (R. J. Argauer and G. R. Landlolt, U.S. Pat., 1982, U.S. Pat. No. 3,702,886), ITQ-2 (A. Corma, V. Fornés, S. B. Pergher, T. L. M. Maesen and J. G. Buglas, Nature, 1998, 396, 353–35), ITQ-6 (A. Corma, U. Diaz, M. E. Domine and V. Fornés, Angew. Chem., 2000, 39, 1499) and MCM-22 (A. Corma, C. Corell and J. Perez-Pariente, Zeolites, 1995, 15, 2). Equally, the support can be a mesoporous aluminosilicate of the type MCM-41 (P. Behrens and M. Haak, Angew. Chem., Int. Ed. Engl. 1993, 32, 696) (P. Behrens, Adv. Mater., 1993, 5, 127), and MCM-48. The detailed description of the manner of obtaining each of these materials can be found in the literature.

2.—Likewise, the same zeolites and mesoporous aluminosilicates containing Al in the lattice were prepared.

3. Likewise, porous supports were used containing Ga in the lattice in zeolites such as BEA, ZSM-5, ITQ-2, MCM-22, MCM-41 and MCM-48.

4. Alternatively, micro- and mesoporous silicates wherein the IIIA group cations $Al^{3+}$, $Ga^{3+}$, $In^{3+}$ and $Tl^{3+}$ could also be used as materials.

All these supports can furthermore contain any alkaline or alkaline earth metal, as well as inorganic cations such as $NH_4^+$ and $H^+$ providing they are free of any structure directing agent and quaternary ammonium cation which might have been used for their synthesis.

The preparation process for the complex consists of the absorption of suitable quantities of 8-hydroxyquinoline or any of its alkyl or halo derivatives, particularly 2-methyl-8-hydroxyquinoline and 2-fluor-8-hydroxyquinoline, in the porous support containing the IIIA group metal either in the structure of the zeolite or as charge compensation cation. The incorporation of the ligand inside the zeolite for the formation of the complex can be carried out in two alternative ways.

The first one consists of stirring a solution of 8-hydroxyquinoline or derivatives in a saturated liquid hydrocarbon or halogenated solvent for between 6 and 24 h at ambient or reflux temperature of the solvent, in the presence of the inorganic support, previously dehydrated by heating to temperatures between 100 and 500° C. and at atmospheric or reduced pressure ($10^{-2}$ Pa) during a period of time varying between 1 and 24 h. The suspension is then filtered and the solid is resuspended in a solution of a suitable salt of the metal ion in solvents such as alcohols, ketones or halogenated solvents, and the suspension is magnetically stirred at between ambient and reflux temperature of the solvent for a period of time between 1 and 24 h. The solid is separated and subjected to exhaustive solid-liquid extraction using $CH_2Cl_2$ as solvent.

In the second procedure, the incorporation of the ligand is done in the solid phase. A mechanical mixture of a suitable quantity of ligand (between 10 and 500 mg per gram of inorganic support) and the desired support containing the IIIA group metal well incorporated into the crystal lattice or present as charge compensation cation is prepared by mixing the two solids in a mortar until maximum uniformity is achieved. This mixture is transferred to an oven and heated for between 12 and 48 h in vacuum at a constant temperature of between 50 and 300° C., or alternatively it is heated by means of a programme wherein the temperature is increased between these margins. Once that stage has ended, the solid is subjected to exhaustive solid-liquid extraction using $CH_2Cl_2$ as solvent, until no additional quantity of 8-hydroxyquinoline or derivatives is recovered.

The quantity of metal complex formed can be estimated on the basis of data from chemical (C, H and N), thermogravimetric and element analysis. In this last case, it is necessary to carry out prior degradation of the solid using a concentrated solution of HF at 60° and analysing the metals, for example by means of quantitative atom absorption spectroscopy.

The structure of the complexes formed encapsulated inside a zeolite was characterised by UV-Vis spectroscopy by diffuse reflectance and IR spectroscopy. In the first case a band was observed with a peak at 250 nm and a shoulder between 300–400 nm characteristic of the ligand-metal electron transfer, while in the IR there appear bands at 1450 and 1610 $cm^{-1}$.

Figure 6:
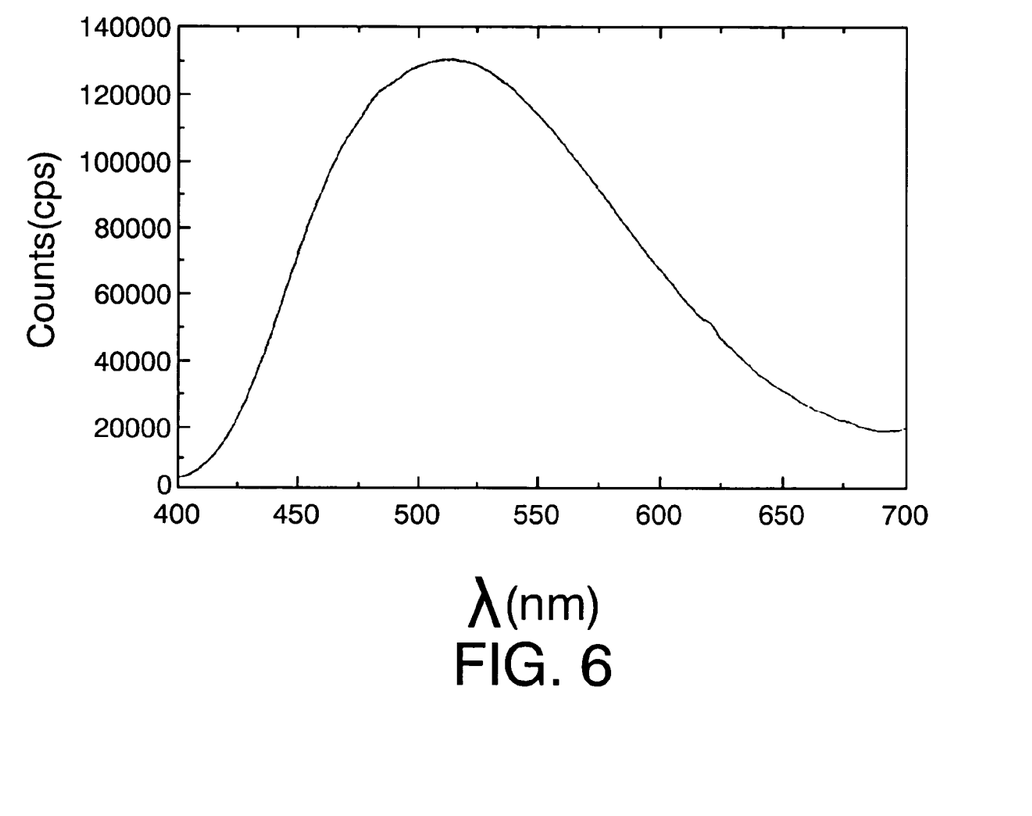
FIG. 6 is an emission spectrum recorded at ambient temperature for a sample of the complex of a IIIA group metal with 8-hydroxyquinoline encapsulated inside zeolite (B) McM-22 (excitation wavelength $\lambda$=350 nm).

All these hybrid materials containing a porous inorganic support and the metal complex exhibit an intense blue emission when the sample is excited with ultraviolet radiation between 350–370 nm. FIG. 6 shows an emission spectrum recorded at ambient temperature for the sample of a complex of a IIIA group metal with 8-hydroxyquinoline encapsulated inside (B) MCM-22 zeolite.

These emission spectra are coincident with those described for the same samples of these complexes without being incorporated into zeolites (L. M. Leung, W. Y. Lo, S. K. So, K. M. Lee and W. K. Choi, J. Am. Chem. Soc., 2000, 12, 5640) (X. T. Tao, H,. Suzuki, t. Wada, S. Miyata and H. Sasabe, J. Am. Chem. Soc., 1999, 121, 9447) (Y. Hamada, h. Kanno, T. Sano, H. Fujii, Y. Nishio, H. Takahashi, T. Usuki and K. Shibata, Appl. Phys. Lett., 1998, 72, 1939). Nevertheless, in some cases, unlike what occurs in the unsupported complex, the micropores of the zeolite do not permit octahedral or square planar coordination around the metal atom owing to the spatial limitation imposed by the crystal structure of the zeolite. However, complexes with 1:1 and 1:2 metal-ligand stoichiometry would be possible and so too would electroluminescence in accordance with the data presented here.

The electroluminescent electrodes based on materials formed from the inorganic matrix and the metal complexes of type II derived from quinoline are prepared in a way analogous to that mentioned for the previous case of electrodes of polyphenylenevinylene derivatives encapsulated in zeolites.

EXAMPLES

Preparation of electroluminescent compounds (derivatives of polyphenylenevinylene or of complexes of IIIA group metals with 8-hydroxyquinoline) encapsulated inside zeolites.

Example 1

Detailed Preparation of polyphenylenevinylene (PPV) encapsulated in CsX zeolite.

| | $R^1$ | $R^2$ | $R^3$ | $R^4$ |
|---|---|---|---|---|
| a | H | H | H | H |
| b | F | F | F | F |

An aqueous solution of 73 mg of p-phenylenedimethylene-1,1-bis(tetrahydrothiophen-1-ium) dibromide (0.033 M) is stirred magnetically at the flux temperature of the solvent in the presence of CsX zeolite in a solid-liquid ratio (238.5 mg in 5 ml of water). The CsX zeolite is obtained by treating commercial NaY zeolite with a solution of caesium acetate (0.4 M) in 5 ml of water per gram of zeolite and stirring the suspension magnetically at 80° C. during 5 h. The resulting zeolite CsX is collected by filtration in vacuum and is used in the preparation of the polymer Ia. In a preferred preparation, the degree of exchange of $Na^+$ for $Cs^+$ was 40%. This zeolite CsX containing the cation p-phenylenedimethylene-1,1-bis(tetrahydrothiophen-1-ium) is heated at 250° C. during 24 h in a reduced pressure atmosphere of 1 mmHg.

Example 2

Detailed preparation of boron 8-hydroxyquinolinate inside (B)-MCM-22 zeolite.

Metal: B, Al, Ga, In, Ti

| | $R^1$ |
|---|---|
| a | H |
| b | $CH_3$ |
| c | F |
| d | $CH_2CH_3$ |

The (B)-MCM-22 zeolite containing boron in the structure of the silicate was prepared in accordance with the process described in U.S. Pat. No. 4,954,325 1990 and which basically consists of crystallisation of the precursor of the (B)-MCM-22 zeolite, starting from the gels TEOS and $H_3BO_3$ using N,N,N-trimethyl (1-adamantyl)ammonium (TMADA'OH) in piperidine, water type miliQ and silica (AEROSIL 200) in a molar ratio:

$SiO_2/B_2O_3=3$; $Piperidine/SiO_2=1.4$; $TMADA'/SiO_2=0.25$; $H_2O/SiO_2=19$

The reaction mixture is stirred mechanically at 175° C. during 7 days. The precursor solid is calcined using a programme wherein the temperature is gradually increased from ambient temperature to 550° C. over a period of 7 h, then maintaining this temperature during 12 h. The calcination is carried in the first 7 h under a nitrogen atmosphere and then in a dry air atmosphere. The gas stream in both cases was 1 ml×min$^{-1}$. This material (81.2 mg; Si/B=12) is mixed mechanically in a mortar with 8-hydroxyquinaldine (43 mg, 2.68 10–4 moles). The resulting mixture is transferred to an oven and is heated at 250° C. during 4 h. After that time, the solid is subjected to an exhaustive solid-liquid extraction using dichloromethane as solvent. The extraction is continued until no more ligand is recovered.

The invention claimed is:

1. An electroluminescent material comprising at least one electroluminescent compound supported in a matrix, wherein
   the matrix is selected from among microporous and mesoporous materials selected from among zeolites, porous oxides, molecular sieves, silicoaluminophosphates and aluminosilicates,
   the electroluminescent compound is selected from among polymers derived from polyphenylenevinylene, complexes of group IIIA metal ions with 8-hydroxyquinoline and combinations thereof, with the proviso that when the matrix is the mesoporous material MCM-41, the electroluminescent compound is not polyphenylenevinylene, and
   the electroluminescent compound is housed in interior spaces of the matrix.

2. A material according to claim 1, wherein the matrix is a zeolite selected from among CsX zeolites, NaY zeolites, CsY zeolites and combinations thereof, and
   the luminescent compound is a conjugated polymer of phenylenevinylene.

3. A material according to claim 1, wherein the matrix is a molecular sieve selected from among the molecular sieves MCM-41, MCM-48, HSM, SBA-15, and combinations thereof.

4. A material according to claim 1, wherein the molecular sieve has an Si/Al ratio of between 5 and ∞.

5. A material according to claim 1, wherein the matrix is a zeolite containing inside a complex comprising at least one IIIA group metal with at least one derivative of 8-hydroxyquinoline.

6. A material according to claim 1, wherein the matrix is MCM-22 zeolite and the complex is a hydroquinolinate complex of boron in its interior.

7. A material according to claim 1, wherein the matrix is a NaY zeolite and the complex is an 8-hydroquinolinate complex of Al encapsulated in the NaY zeolite.

8. A material according to claim 1, wherein the matrix is a NaY zeolite comprising an encapsulated 8-hydroquinolinate complex of Ga.

9. A material according to claim 1, wherein the matrix is a (B) MCM-41 zeolite and the complex is an encapsulated 8-hydroquinolinate complex of Al.

10. A material according to any one of claims 1–2 and 3–8, also comprising a doping agent.

11. A material according to claim 10, wherein the doping agent is selected from among metal ions, electron donors organic molecules, electron acceptor organic molecules and combinations thereof.

12. A process for preparing an electroluminescent material according to claim 1, comprising
  a first stage wherein the inorganic material with ion exchange capacity selected from among zeolites, porous oxides, molecular sieves, silicoaluminophosphates and aluminosilicates is subjected to ion exchange with a solution of p-phenylenedimethylene-1,1-bis(tetrahydrothiophen-1-ium) bromide in order to obtain an exchanged impregnated material;
  a second stage comprising subjecting the impregnated material to heating until a polymer derived from polyphenylenevinylene encapsulated in the impregnated material is formed; and
  a third stage wherein the electroluminescent material is purified by means of extraction.

13. A process according to claim 12, wherein the inorganic material is a zeolite selected from among CsX zeolites, NaY zeolites, CsY zeolites and combinations thereof.

14. A process according to claim 12, wherein the inorganic material is zeolite in Al/MCM-41.

15. A process according to claim 12, wherein the inorganic material is a molecular sieve selected from among the molecular sieves MCM-41, MCM-48, HSM, and SBA-15 and combinations thereof.

16. A process according to claim 12, wherein the molecular sieve has an Si/Al ratio of between 5 and $\infty$.

17. A process for preparing an electroluminescent material according to claim 1, comprising
  forming complexes of IIIA group metal ions with a compound of 8-hydroxyquinoline selected from among 8-hydroxyquinoline and derivatives of 8-hydroxyquinoline inside an inorganic material selected from among zeolites, porous oxides, molecular sieves, silicoaluminophosphates and aluminosilicates in order to obtain a solid which forms an inorganic matrix wherein said complexes are formed; and
  separating the solid and subjecting the extracted solid to a solid-liquid extraction in a solvent in order to obtain the electroluminescent material.

18. A process according to claim 17, wherein the complexes between the IIIA group metal ions and the compound are formed by means of a suspension stage wherein the inorganic material in which the compound is impregnated is suspended in a solution of a salt of the IIIA group metal ions in a solvent.

19. A process according to claim 18, wherein the solvent is selected from among alcohols, ketones and halogenated solvents.

20. A process according to claim 18, wherein the suspension is stirred at a temperature between ambient and reflux temperature, during 2 to 24 hours.

21. A process according to claim 17, wherein the complexes are complexes of 8-hydroxyquinolinate of Ga and the inorganic support is Al—NaY zeolite prepared starting from NaY zeolite exchanged with $Al^{3+}$.

22. A process according to claim 17, wherein the complexes are complexes of 8-hydroxyquinolinate of B and the inorganic support is Ga—NaY zeolite prepared starting from NaY zeolite exchanged with Ga.

23. A process according to claim 17, wherein the complexes are complexes of 8-hydroxyquinolinate of Al and the inorganic support is (B) MCM-41 prepared starting from MCM-41 exchanged with $Al^{3+}$.

24. A process according to claim 17, wherein the inorganic support has previously been impregnated with 8-hydroxyquinoline dissolved in dichloromethane and heated.

25. A process according to claim 17, wherein the complexes between the IIIA group metal ions and the compound are formed by means of the stages of
  mixing the inorganic material containing the IIIA group metal in its crystal lattice, as charge compensation cation, or both, in its crystal lattice and as charge compensation cation, with the compound in solid form, until a uniform mixture is obtained; and
  heating the mixture in vacuum for between 12 and 48 hours at a temperature between 50 and 300° C.

26. A process according to claim 17, wherein the complex is boron hydroxyquinolinate, the compound is 8-hydroxyquinaldine and the inorganic support is MCM-22.

27. A process according to claim 17, wherein the extraction is carried out using $CH_2Cl_2$ as solvent.

28. A device comprising two electrodes, one of the electrodes comprising at least one material according to any one of claims 1–9 and 11 supported on it.

29. A micrometric film comprising a material according to any one of claims 1–9 and 11.

* * * * *